United States Patent [19]

Su

[11] Patent Number: 5,132,241
[45] Date of Patent: Jul. 21, 1992

[54] METHOD OF MANUFACTURING MINIMUM COUNTERDOPING IN TWIN WELL PROCESS

[75] Inventor: Wen-Doe Su, Yun Lin, Taiwan

[73] Assignee: Industrial Technology Research Institute, Hsinchu, Taiwan

[21] Appl. No.: 684,830

[22] Filed: Apr. 15, 1991

[51] Int. Cl.⁵ .......................................... H01L 21/302
[52] U.S. Cl. .................................... 437/70; 437/34; 437/69; 437/73; 437/36; 148/DIG. 82; 148/DIG. 103; 148/DIG. 117
[58] Field of Search .................. 437/69, 70, 73, 34, 437/968, 36, 80; 148/DIG. 82, DIG. 117

[56] References Cited

U.S. PATENT DOCUMENTS

| | | | |
|---|---|---|---|
| 4,434,543 | 3/1984 | Schwabe et al. | 437/70 |
| 4,435,895 | 3/1984 | Parrillo et al. | 437/70 |
| 4,516,316 | 5/1985 | Haskell | 437/70 |
| 4,743,566 | 5/1988 | Bastiaens et al. | 437/70 |
| 4,755,477 | 7/1988 | Chao | 437/73 |
| 4,803,179 | 2/1989 | Neppl et al. | 437/70 |
| 4,829,019 | 5/1989 | Mitchell et al. | 437/70 |
| 5,024,961 | 6/1991 | Lee et al. | 437/70 |

FOREIGN PATENT DOCUMENTS

| | | | |
|---|---|---|---|
| 0061139 | 5/1981 | Japan | 437/70 |
| 0252425 | 10/1988 | Japan | 437/70 |
| 0289832 | 11/1988 | Japan | 437/70 |

*Primary Examiner*—Brian E. Hearn
*Assistant Examiner*—Tuan Nguyen
*Attorney, Agent, or Firm*—George O. Saile

[57] ABSTRACT

An improved method for manufacturing high density CMOS integrated circuits which minimizes counterdoping of the N and P well structures includes providing a composite masking layer which has layers of silicon oxide, polycrystalline silicon and silicon nitride over a silicon monocrystalline substrate. A mask layer pattern is formed from the composite masking layer by lithography and anisotropic etching which removes the silicon nitride and the portion of the thickness of the polycrystalline silicon over areas designated to be the N well structure. The mask layer pattern is subjected to isotropic etching of the polycrystalline silicon to remove the remaining exposed thickness of polycrystalline silicon and to undercut etch the polycrystalline silicon under the silicon nitride portion of the mask layer pattern. The N well structure is ion implanted and formed by using the silicon nitride layer portion of the mask layer pattern as the mask. The silicon substrate over the N well and the exposed the polycrystalline silicon layer under the silicon nitride layer of the mask layer pattern is oxidized to form an N well silicon oxide pattern. The mask layer pattern is removed. The P well structure is ion implanted and formed using the N well silicon oxided pattern as the mask. The P well structure has minimized counterdoping by these process steps. All the silicon oxide from the surface of the silicon substrates are removed. Field oxide isolating structures are formed at the juncture of P well and N well structures.

20 Claims, 4 Drawing Sheets

METHOD OF MANUFACTURING MINIMUM COUNTERDOPING IN TWIN WELL PROCESS

BACKGROUND OF THE INVENTION

(1) Field of the Invention

The invention relates generally to the manufacture of very high integrated circuits and more particularly to methods for forming patterns of N well and P well in a silicon substrate in ways that minimize counterdoping.

(2) Description of the Prior Art

In the formation of complimentary devices, such as complimentary metal oxide semiconductor, CMOS field effect transistor integrated circuits in a silicon semiconductor substrate it is required to provide regions in the substrate tailored for the each type of transistor. For example, in the case of CMOS field effect transistor integrated circuits, the P channel devices must be located in regions having an N type doping and the N channel devices must be located in regions having a P type doping. There are three approaches to forming the two different substrate doping, which are referred to as P tub or well, N tub or well, and twin tub or well processes.

The most preferred of the three processes is the twin tub or well process, particularly in the era of very high density integrated circuits with feature sizes of one micrometer or below. In general, the advantage is that the process allows the doping profile in each tub or well region to be independently tailored for optimum device characteristics. The substrate itself can be either lightly doped P or N type.

Workers in the art have been active in developing twin tub or well processes. Some of the patents and publications which are considered significant include Davies et al U.S Pat. No. 4,420,344; Schwabe et al U.S. Pat. No. 4,434,543; Hillenius et al U.S. Pat. No. 4,554,726; Pfiester U.S. Pat. No. 4,847,213; and S. Meguro et al entitled "Hi-CMOS III Technology" published in IEDM 84 pages 59-62 CH2099-0/84/0000-0059 1984 IEDM.

A major problem in the twin tub or well processes involve the overlapping of the tub or well patterns of P and N doping types. The compensation degree has adverse effects on the device formed in the twin wells, especially on the latch-up protection of CMOS circuits.

Neppl et al U.S. Pat. No. 4,803,179 has observed the counterdoping problem and has proposed a process to overcome this problem. They use an undercutting etch technique of the silicon nitride layer located under a photoresist mask which defines the well region. Their preferred process of FIG. 6 through 10 uses a polysilicon layer between their silicon nitride layer and the silicon oxide layer. To ion implant through the polysilion will require a specialized high energy implanter.

It is therefore an object of this invention to provide a process that overcomes or minimizes the counterdoping of the twin well structures of the prior art by simpler procedures.

It is a further object of the invention to provide a process that overcomes or minimizes the counterdoping of adjacent P and N wells by use of an improved mask undercut technique in the polycrystalline silicon layer under the silicon nitride layer and to allow the use of conventional low energy implantation equipment.

SUMMARY OF THE INVENTION

An improved method for manufacturing high density CMOS integrated circuits which minimizes counterdoping of the N and P well structures includes providing a composite masking layer which has layers of silicon oxide, polycrystalline silicon and silicon nitride over a silicon monocrystalline substrate. A mask layer pattern is formed from the composite masking layer by lithography and anisotropic etching which removes the silicon nitride and the portion of the thickness of the polycrystalline silicon over areas designated to be the N well structure. The mask layer pattern is subjected to isotropic etching of the polycrystalline silicon to remove the remaining exposed thickness of polycrystalline silicon and to undercut etch the polycrystalline silicon under the silicon nitride portion of the mask layer pattern. The N well structure is ion implanted and formed by using the silicon nitride layer portion of the mask layer pattern as the mask. The silicon substrate over the N well and the exposed the polycrystalline silicon layer under the silicon nitride layer of the mask layer pattern is oxidized to form an N well silicon oxide pattern. The mask layer pattern is removed. The P well structure is ion implanted and formed using the N well silicon oxide pattern as the mask. The P well structure has minimized counterdoping by these processss steps. All the silicon oxide from the surface of the silicon substrate are removed. Field oxide structures are formed at the juncture of P well and N well structures. The desired complimentary devices integrated circuits are now formed in and on the silicon substrate.

By use of this improved twin well process the counterdoping between the N and P well regions are minimized. The undercut etch of polycrystalline silicon can be well controlled and is easy to accomplish. It is a greatly preferred technique from a manufacturing process point of view to accurately space the P and N well regions. The definition of the undercutting can be improved by the additions of a silicon oxide layer between the silicon nitride and polycrystalline silicon layer. Also, a P type field implant can be used only in the P well regions to prevent leakage under the field oxide isolating structures.

DESCRIPTION OF THE PREFERRED EMBODIMENTS

Figure 1:
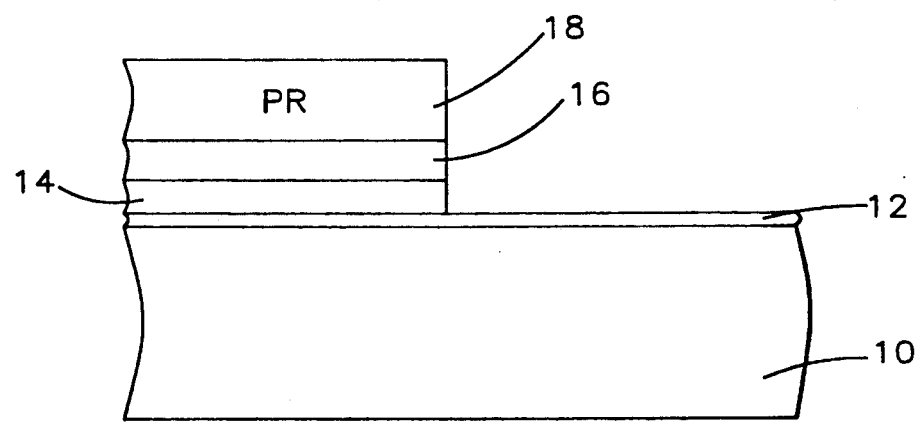
FIG. 1 through 7 illustrate a schematic cross sectional representation of an embodiment for forming the P well and N well structure of the invention that has minimized counterdoping.

Referring now more particularly to FIG. 1 wherein the first embodiment of the present invention begins the formation of the complimentary metal oxide semiconductor (CMOS) integrated circuit. A monocrystalline (100) oriented silicon substrate 10 is provided having a low doping concentration of P or N type as is well known in the art. An epitaxial layer (not shown) may or may not be formed upon the active, upper surface of the substrate. A silicon oxide layer 12 is formed upon the active surface of substrate 10. The formation of silicon oxide layer 12 may be by thermal oxidation in a wet oxygen atmosphere at about 900° C. The thickness of the layer 12 is operably between about 100 to 1000 Angstroms and preferred to be about 350 Angstroms. The polycrystalline silicon layer 14 is now deposited preferably by low pressure chemical vapor deposition using silane as the source gas. The operable thickness of the layer 14 is between about 1000 to 10000 Angstroms and the preferred thickness is about 3000 Angstroms. The silicon nitride layer 16 is now deposited preferably by low pressure chemical vapor deposition using silane or dichlorsilane and ammonia. The operable thickness of the layer 16 is between about 1000 to 3000 Angstroms and preferably about 1500 Angstroms. This forms the composite masking layer 12, 14, 16.

A mask layer pattern is now formed from the composite making layer by lithography and anisotropic etching. Resist pattern mask 18 is used for this purpose. This is done by removing the silicon nitride layer and polycrystalline silicon over areas designed to be N well structure. However, should some polycrystalline silicon 14 remain over designated N well areas there would be no adverse effect. The lithography and anisotropic etching is conventional as is known by those skilled in the field. The result of these process steps is shown in FIG. 1. The silicon oxide layer 12 underneath the polycrystalline silicon layer is used as an etching stop. The silicon oxide layer 12 will loose about 100 Angstroms in thickness after the etching process.

The FIG. 1 structure is now subjected to isotropic etching of the exposed polycrystalline silicon layer 14 using the mask layer pattern. Either a plasma isotropic etch using sulfur hexafluoide and oxygen or a wet or chemical isotropic etch with a potassium hydroxide being used. The result of the etching which is the removal of the exposed polycrystalline silicon layer 14 and the undercutting of the silicon nitride layer 16 (removal or cutting of the polycrystalline silicon layer 14) as is seen at 20 in FIG. 2. Wet etching is preferred to improve selectively of etching of the polycrystalline silicon layer 14 to the silicon nitride layer 16 and silicon oxide layer 12. The extent of undercutting (or removal of layer 14) at 20 is controlled by the time of wet etching, and the desired undercutting ectent is between about 0.35 to 1.0 micrometers.

Figure 2:
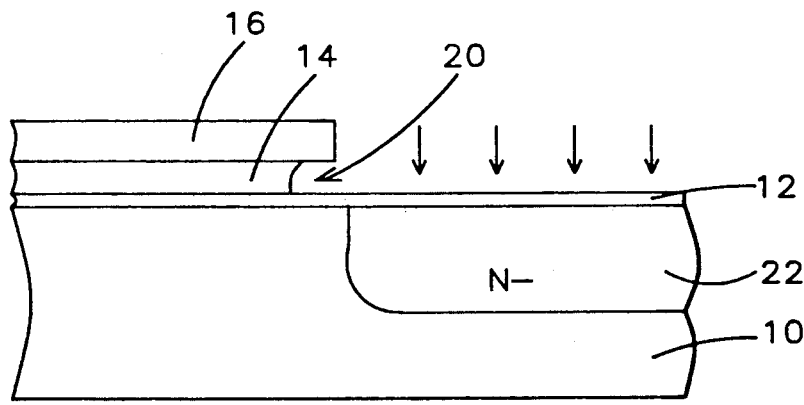

The lithography mask 18 is removed. The N well 22 is now formed by ion implantation of N ions, such as phosphorus or arsenic as indicated by arrows. The concentration is in the range of 1 E 12 to 1 E 13 ions per $cm^2$ and the energy in the range of about 80 to 180 KEV. FIG. 2 is now completed.

Figure 3:
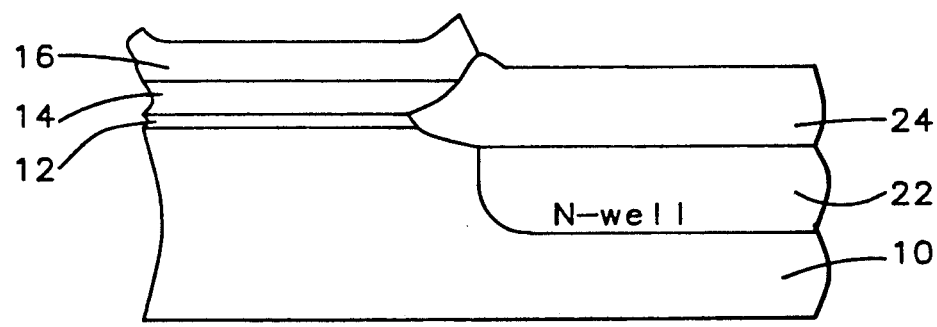

Referring now to FIG. 3, the N well silicon oxide pattern 24 is now formed by typically a thermal wet oxidation process at a temperature of about 980° C. The silicon substrate under silicon oxide layer 12 and the exposed polycrystalline silicon edges of layer 14 are oxidized during this process. It can be seen how the undercut 20 aids in forming the N well silicon oxide pattern 24 beyond the reaches of the N well pattern itself. The mask layer pattern 14, 16 is now removed by using two etching techniques. First, the silcon nitride layer is stripped using, for example hot phosphoric acid as is known in the art and second using for, example a plasma reactor with chlorine or flourine as the reactive specie as is known in the art. The pattern 24 acts as the mask for these etching processes.

Figure 4:
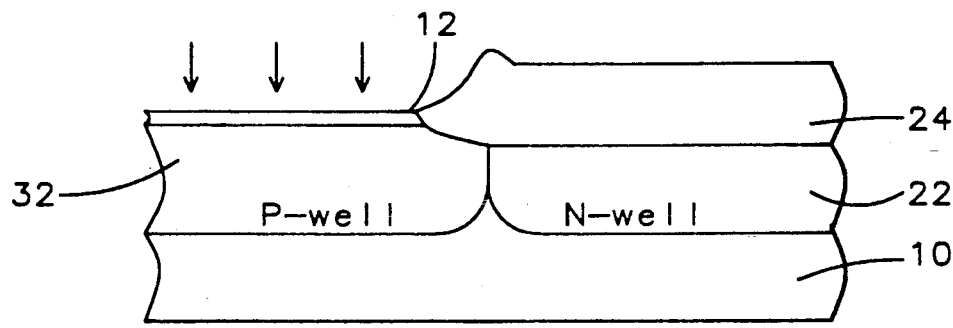

The P well 32 is now formed using the pattern 24 as the ion implantation mask. The arrows indicate the ion implantation of a P type dopant, such as boron. The dopant level in the P well is in the range of 1 E 12 to 1 E 13 atoms per $cm^2$ and the energy in the range of about 30 to 100 KEV. The well drivein step is accomplished using the conditions of about 1100° C. for about 6 hours in a nitrogen and oxygen ambient to completely form both the N and P wells, 22 and 32 respectively. This final well structure is shown in FIG. 4. It is important to understand that the undercut 20, N and P well doping concentrations, and the drivein process have been designed to allow minium counterdoping of the wells.

Figure 5:
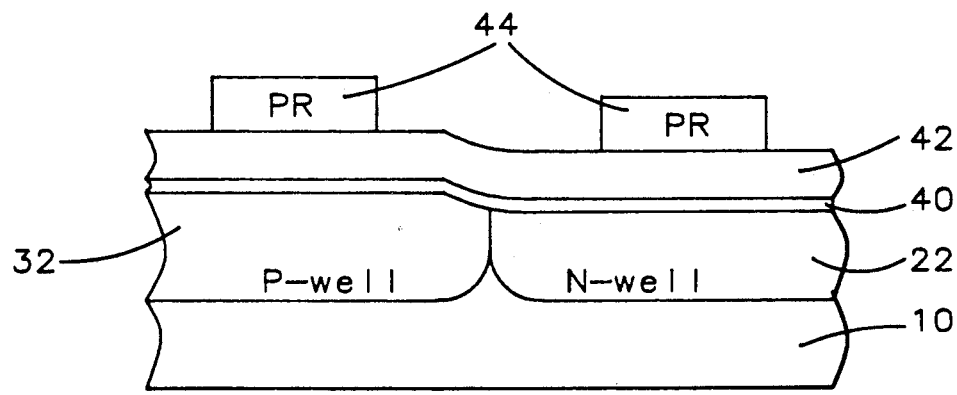
Figure 6:
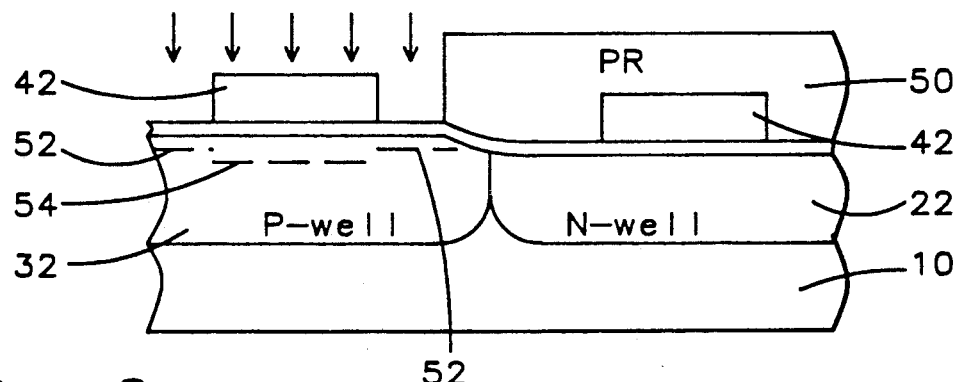
Figure 7:
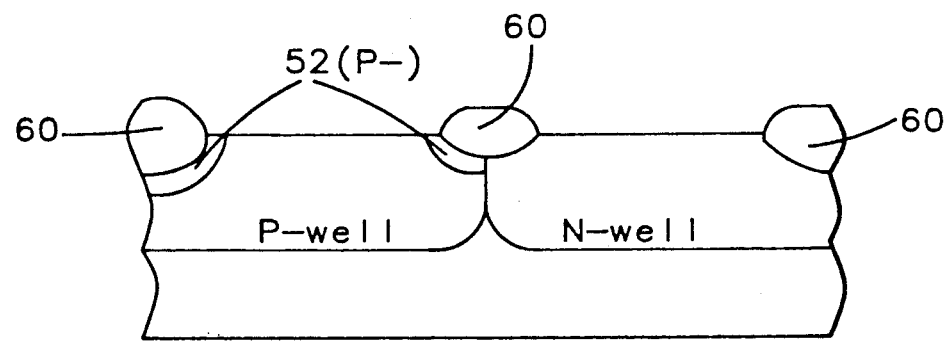
Figure 8:
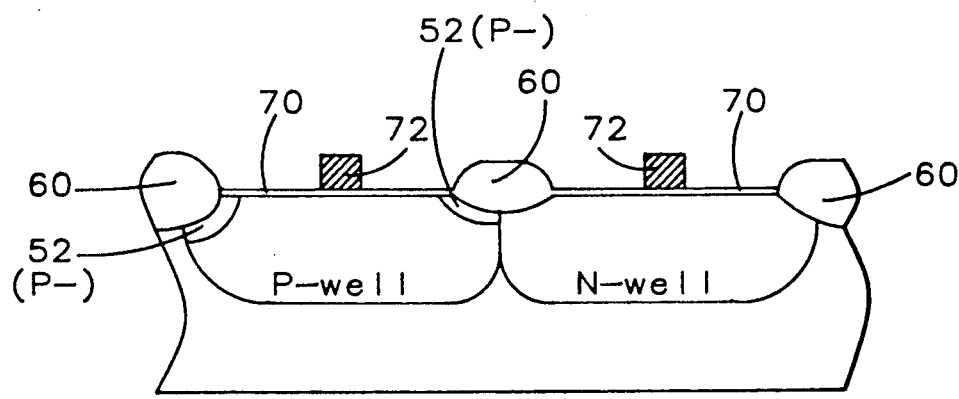
FIGS. 8 through 12 is a schematic cross sectional representation of an embodiment for making a high density CMOS field effect transistor integrated circuit using the improved twin well formation processing of FIGS. 1 through 7.

Referring now more particularly to FIGS. 5 through 7 for the preferred processes to form the formation of the field oxide surface isolating structures 60 at the junctures of the P and N well patterns. All silicon oxide patterns, such as silicon oxide layer 12 and N well silicon oxide pattern 24 are stripped from the active surface of the substrate using typically an aqueous hydrofluoric acid solution as is known in the art. A pad silicon oxide layer 40 is thermally grown having a thickness of about 500 Angstroms. A silicon nitride layer 42 is low pressure chemical vapor deposited to a thickness of about 1500 Angstroms. Lithography is used to deposit resist, expose, develop and etch to form resist mask pattern 44 as shown in FIG. 5 to define the planned active device regions with this mask as is known in the art.

The silicon nitride layer 42 is etched using reactive ion anisotropic etching using the mask 44. The resist mask is removed by conventional stripping.

It is preferred to form a field doped P region 52 under the planned field oxide isolating region 60 to prevent leakage under this field oxide region. It is also preferred to have this P region 52 only within the P well to improve the device isolation characteristics. The field implantation is defined by lithography and etching to form resist mask 50 as shown in FIG. 6. P ions as indicated by the arrows in FIG. 6 implant to form regions 52. The doping concentration is about 4 E 13 atoms per $cm^2$ at 25 KEV. and is characterized as P—. The dopant used is normally boron.

It is also useful to have a deep P region 54 formed under the silicon nitride layer 42 at this time. This deep P implantation is normally boron implantation of 9 E 11 atoms per $cm^2$ at an energy of about 150 KEV. The reason for this desired implantation is to improve the performance of the NMOS, like off leakage or punchthrough. The energy is designed not to allow penetration of dopant through the field oxide layer 60. The result of these processes is shown in FIG. 6.

The field oxide insulating structure 60 is formed by thermal oxidation under the conditions of about 985° C. in a wet oxygen ambient for the necessary time to obtain the desired thickness of layer 60. The preferred thickness of the field oxidation 60 is between about 5000 and 8000 Angstroms and typically about 6000 Angstroms. The silicon nitride layer 42 is stripped using hot phosphoric acid and the silicon oxide layer 40 is removed using an aqueous hydrofluoric acid solution. The known technique of use of a sacrificial oxide growth and strip may be use to better prepare the active device regions for device formation. The result is shown in FIG. 7.

Various types of integrated circuit devices can be formed in the improved twin well structure formed by the FIGS. 1 through 7 processing. For example, CMOS field effect transistor devices, complimentary bipolar transistor devices, combinations of bipolar and CMOS field effect transistor devices, and the like as is well recognized by those skilled in the art.

Referring now more particularly to FIGS. 8 through 12, there is shown an embodiment for making CMOS field effect transistors in the improved twin well structure shown in FIG. 7. A gate silicon oxide layer 70 is grown upon the active regions of P well 32 and N well 22 pattern in the substrate 10. It is normally grown by thermal oxidation in a wet oxygen atmosphere at about 900° C. The thickness of the layer is between about 50 to 200 Angstroms. A polycrystalline silicon layer 72 is blanket deposited over the surfaces 70 and 60 of the structure. The layer 72 is deposited by chemical vapor deposition from a silane source as in well known in the art. The thickness of the layer 72 is preferably between about 2000 to 5000 Angstroms. The layer 72 may be formed undoped or doped as deposited. Where it is formed undoped, a doping of the layer with, for example phosphorus using phosphorus oxychloride is normal. The layer 72 is patterned by conventional lithography and etching to form, at least the polycrystalline silicon gate electrode structure shown in the FIG. 8.

Figure 9:
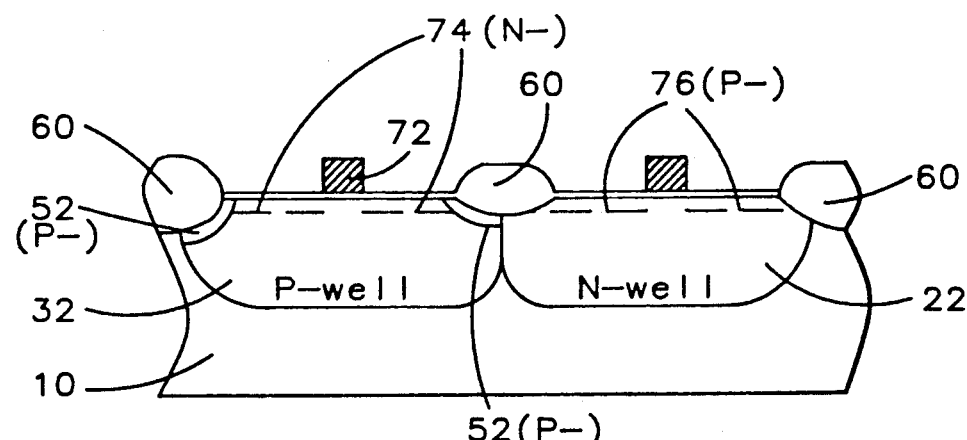
Figure 10:
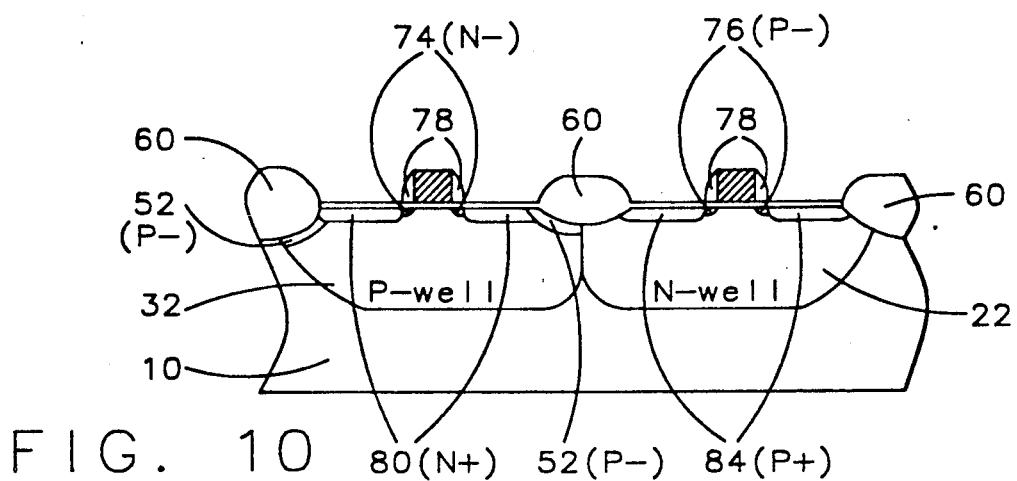
Figure 11:
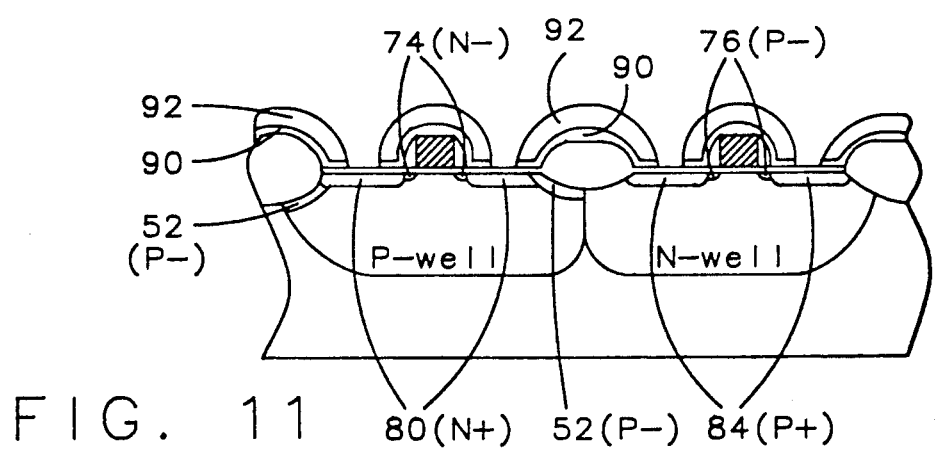
Figure 12:
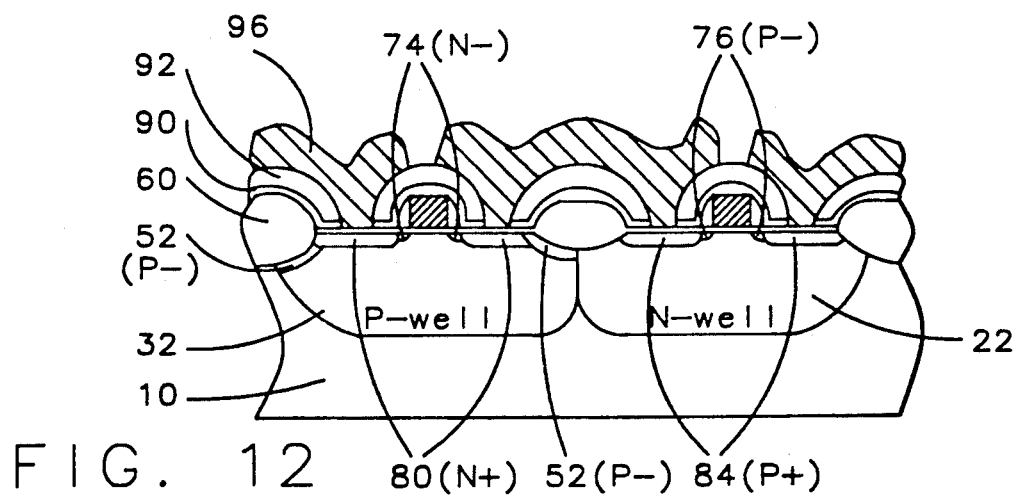

The source/drain structure of the CMOS FET may now formed by the following steps. The FIGS. 9 through 11 illustrate the formation of the CMOS FET integrated circuit device. The ion implantations of N− dopant for the lightly doped N channel devices and P− dopant for the lightly doped P channel devices are shown already in place in FIG. 9. Lithographic masks (not shown) are required to protect the areas not to be subjected to that particular N− or P− ion implantation as is understood by those in the art. The formation of the lithographic masks are done by conventional lithography and etching techniques. The N− lightly doped drain implantation 74 is done with for example phosphorous P31 at a dose of 1.5 E 13 atoms per cm$^2$ and with an energy of 50 KEV. The P− lightly doped drain implantation 76 is done with for example boron difluoride BF$_2$ at a dose of about 2 E 13 atoms per cm$^2$ and with an energy of 50 KEV.

The dielectric spacer 20 will now be formed followed by the completion of the lightly doped drain source/drain structures and may be better understood with reference to FIG. 10. A low temperature silicon dioxide deposition is preferred such as through the chemical vapor deposition of tetraethoxysilane (TEOS) at a temperature in the range of between about 650° to 750° C. However, it is generally preferred to have the spacer formation layer at the 700° C. The thickness of the dielectric silicon dioxide layer is between about 1500 to 3000 Angstrom and preferably about 2500 Angstroms.

An anisotropic etching of this layer produces the dielectric spacer layer 78 on the sidewalls of the gate electrode structures 72. The preferred anisotropic etching uses a plasma dry etching apparatus with carbon hydrogen trifluoride and helium gases to etch the layer of silicon dioxide at a pressure of about 3 Torr.

Referring now to FIG. 10, the N+ source/drain ion implantation uses, for example Arsenic, As75 with a dose of 5 E 15 square cm. and energy of about 80 KEV. to complete the source/drain regions 80 of the N channel lightly doped drain MOS FET integrated circuit device. The P+ source/drain ion implantation uses, for example BF$_2$ with a dose of 4 E 15 square cm. and energy of about 50 KEV. to complete the source/drain regions 84 of the P channel lightly doped drain MOS FET integrated circuit device. These ion implantations, of course require resist block out masks to keep unwanted ions from certain regions as is known in the art.

An insulating layered structure composed of a layer of silicon dioxide 90 and a much thicker layer of borophosphosilicate glass, phosphosilicate glass or similar insulating layer 92. The operational thicknesses of these layers are between about 1000 to 2000 Angstroms for the oxide layer and between about 4000 to 10,000 or more Angstroms for the glasseous layer. These layers are typically deposited by chemical vapor deposition in low pressure or atmospheric pressure, or in a plasma enhance reactive chamber.

The contact windows or openings are now formed through the insulating layered structure to the source/drain regions in the device regions. This process step is conventionally done by lithography and etching techniques which preferably use a reactive ion etching process that will anisotropically etch both components of the layered structure 90, 92. A typical reactive ion etching process using fluorine containing etching chemical species. These oxide/glass layers etching processes are well known to those in the art. The size of the contact window opening can be as small as limitation of the etching and lithography patterning capability. This completes the FIG. 11 structure.

The metallurgical connections are completed by deposition of layer 96 and the subsequent patterning thereof using conventional lithography and etching. The metallurgical connections may be composed of one or more layers as is known in the art. Typically a barrier layer, such as titanium or titanium-tungsten is used as the first layer and the second layer may be aluminum, aluminum-silicon, aluminum-silicon-copper, conductively doped polysilicon, tungsten or the like. This completes the FIG. 12.

While the invention has been particularly shown and described with reference to the preferred embodiments thereof, it will be understood by those skilled in the art that various changes in form and details may be made without departing from the spirit and scope of the invention.

What is claimed is:

1. An improved method for manufacturing high density CMOS integrated circuits which minimizes counterdoping of the N and P well structures comprising:

providing a composite masking layer which includes layers of silicon oxide, polycrystalline silicon and silicon nitride over a silicon monocrystalline substrate;

forming a mask layer pattern from said composite masking layer by lithography and anisotropic etching which removes the said silicon nitride and the said polycrystalline silicon over areas designated to be said N well structure; subjecting the mask layer pattern to isotropic etching of said polycrystalline silicon to remove the remaining exposed said polycrystalline silicon and to undercut etch into the said polycrystalline silicon under the said silicon nitride portion of said mask layer pattern;

ion implanting and forming said N well structure using said silicon nitride layer portion of said mask layer pattern as the mask;

oxidizing said silicon substrate over said N well and the exposed said polycrystalline silicon layer under the said silicon nitride layer of said mask layer pattern to form an N well silicon oxide pattern;

removing said mask layer pattern;

ion implanting and forming said P well structure using said N well silicon oxide pattern as the mask, which P well structure has minimized said counterdoping;

removing all said silicon oxide from the surface of said silicon substrate;

forming field oxide isolating structures at the juncture of said P well and said N well structures; and forming said CMOS integrated circuits in and on said silicon substrate.

2. The method of claim 1 wherein there is a field P region under said field oxide isolating structures and said P region is only within the said P well structure.

3. The method of claim 2 wherein said field P region is formed by boron ion implatation using a block out mask of the regions other than the P well structure and the silicon nitride field oxide isolating structure mask before the said field oxide isolating structure is formed.

4. The method of claim 1 wherein the undercut of the silicon nitride layer into the said polycrystalline silicon layer is between about 3500 to 10000 Angstroms.

5. The method of claim 1 wherein the isotropic etch is composed of potassium hydroxide solution.

6. The method of claim 1 wherein the isotropic etch is composed of a sulfur hexafloride and oxygen plasma.

7. The method of claim 1 wherein said composite masking layer further comprises a second layer of silicon oxide between said polycrystalline silicon and silicon nitride layers and said composite masking layer and said composite masking layer thickness of said silicon oxide is between about 200 to 1000 Angstroms and said polycrystalline silicon is between about 3500 to 10000 Angstroms.

8. The method of claim 3 wherein after said boron ion implantation to form P field region, ion implantation of a deep P region through said silicon nitride mask is performed.

9. In an improved method for the manufacture of patterns of N and P wells in a high density CMOS integrated circuit structure, wherein counterdoping between N and P wells are minimized comprising:

providing a mask pattern of a composite layer on said monocrystalline silicon substrate;

said composite layer includes a layer of silicon oxide, a layer of polycrystalline silicon and a layer of silicon nitride from the said substrate and has the function to be the mask for the subsequent formation of said N wells;

conducting isotropic etching of said polycrystalline silicon layer to undercut said silicon nitride layer;

ion implanting and forming said N wells using the silicon nitride layer poriton of said mask pattern;

oxidizing said silicon substrate over said N wells and the exposed said polycrystalline silicon layer under the said silicon nitride layer of said mask layer pattern to form an N well silicon oxide pattern whereby there is a space between the N wells and the subsequent to be produced said P wells to minimize said counterdoping;

removing said mask layer pattern;

ion implanting and forming said P well structure using said N well silicon oxide pattern as the mask, which P well structure has minimized said counterdoping;

removing all said silicon oxide from the surface of said silicon substrate;

forming field oxide isolating structures at the juncture of said P well and said N well structures; and forming said CMOS integrated circuits in and on said silicon substrate.

10. The method of claim 9 wherein there is a field P region under said field oxide isolating structures and said P region is only within the said P well structure.

11. The method of claim 10 wherein said field P region is formed by boron ion implantation using a block out mask of the regions other than the P well structure and the silicon nitride field oxide isolating structure mask before the said field oxide isolating structure is formed.

12. The method of claim 9 wherein the undercut of the silicon nitride by removal of the said polycrystalline silicon is between about 3500 to 10000 Angstroms and wherein the isotropic etch is composed of potassium hydroxide solution.

13. The method of claim 9 wherein the isotrophic etch is composed of a sulfur hexafluoride and oxygen plasma.

14. The method of claim 9 wherein said composite masking layer further comprises a second layer of silicon oxide between said polycrystalline silicon and said silicon nitride layers and said composite masking layer thickness of said silicon oxide is between about 200 to 1000 Angstroms and said polycrystalline silicon is between about 3500 to 1000 Angstroms.

15. In an improved method for the manufacture of patterns of N and P wells in a high density integrated circuit structure, wherein counterdoping between N and P wells are minimized comprising:

providing a mask pattern of a composite layer on said monocrystalline silicon substrate;

said composite layer includes a layer of silicon oxide, a layer of polycrystalline silicon and a layer of silicon nitride from the said substrate and has the function to be the mask for the subsequent formation of said N wells;

conducting isotropic etching of said polycrystalline silicon layer to undercut said silicon nitride layer;

ion implanting and forming said N wells using the silicon nitride layer portion of said mask pattern;

oxidizing said silicon substrate over said N wells and the exposed said polycrystalline silicon layer under the said silicon nitride layer of said mask layer pattern to form an N well silicon oxide pattern whereby there is a space between the N wells and the subsequent to be produced said P wells to minimize said counterdoping;

removing said mask layer pattern; and forming said P well structure using said N well silicon oxide pattern as the mask, which P well structure has minimized said counterdoping.

16. The method of claim 15 wherein a field P region is formed under said field oxide isolating structures and said P region is only within the said P well structure, by boron ion implantation using a block out mask of the regions other than the P well structure and the silicon nitride field oxide isolating structure mask before the said field oxide isolating structure is formed.

17. The method of claim 15 wherein the undercut of the silicon nitride into the polycrystalline silicon layer is between about 3500 to 10000 Angstroms and wherein the isotropic etch is composed of potassium hydroxide.

18. The method of claim 15 wherein the undercut of the silicon nitride into the polycrystalline silicon layer is between about 3500 to 10000 Angstrom and wherein the isotropic etch is composed of sulfur hexaflouride and oxygen plasma.

19. The method of claim 15 wherein said composite masking layer thickness of said silicon oxide is between about 200 to 1000 Angstroms and said polycrystalline silicon is between about 3500 to 1000 Angstroms.

20. The method of claim 15 wherein CMOS integrated circuits are formed in said silicon monocrystalline substrate.

* * * * *